(12) United States Patent
Morita

(10) Patent No.: US 6,549,250 B2
(45) Date of Patent: Apr. 15, 2003

(54) STRUCTURE CAPABLE OF PREVENTING DAMAGE CAUSED BY STATIC ELECTRICITY

(75) Inventor: Keizo Morita, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 0 days.

(21) Appl. No.: 09/784,425

(22) Filed: Feb. 15, 2001

(65) Prior Publication Data
US 2001/0020547 A1 Sep. 13, 2001

(30) Foreign Application Priority Data

Mar. 7, 2000 (JP) ........................................ 2000-062508

(51) Int. Cl.[7] ............................................. G02F 1/1335
(52) U.S. Cl. ........................................................ 349/40
(58) Field of Search ........................................ 349/40, 39

(56) References Cited

U.S. PATENT DOCUMENTS 5,313,319 A * 5/1994 Salisbury ..................... 349/40

* cited by examiner

Primary Examiner—James Dudek
(74) Attorney, Agent, or Firm—Greer, Burns & Crain, Ltd.

(57) ABSTRACT

In the semiconductor integrated circuit, an auxiliary conductor is formed in a wiring layer beneath a signal wire which connects a position Vin estimated to generate static electricity and a position Vout to be protected from static electricity. The capacitance of a glass substrate can be reduced to $\frac{1}{1000}$ of the capacitance of the interlayer insulating film. Accordingly, even if a voltage of 1000 to 2000 V is generated between a substrate conveying system and the auxiliary conductor, the glass substrate works as a dielectric, and the voltage generated between the auxiliary conductor and signal wire is only several volts.

17 Claims, 14 Drawing Sheets

FIG.4
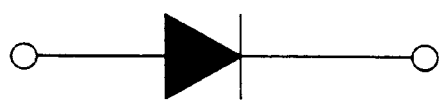
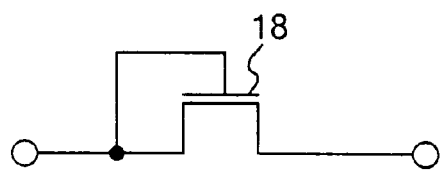
N-TYPE
FIG.5
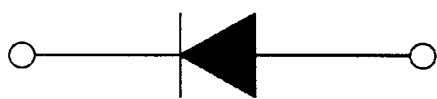
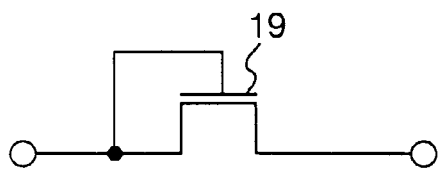
P-TYPE

STRUCTURE CAPABLE OF PREVENTING DAMAGE CAUSED BY STATIC ELECTRICITY

FIELD OF THE INVENTION

The present invention in general relates to a structure that prevents a semiconductor integrated circuit from being damaged due to static electricity (hereafter, a structure for preventing damage caused by static electricity). More particularly this invention relates to a structure for preventing damage caused by static electricity relating to a semiconductor integrated circuit formed on a glass substrate or the like, such as drive circuit integrated type active matrix liquid crystal display device formed by using a polysilicon thin film transistor.

BACKGROUND OF THE INVENTION

These days, in order to lower the cost of the liquid crystal display device, a technology of forming a polysilicon thin film transistor on a glass substrate in low temperature process is drawing attention. According to this technology, together with the liquid crystal display panel, peripheral circuits such as driver circuit can be incorporated in the glass substrate. As a result, the driving IC which was used conventionally is not required, and hence the cost is lowered. However, when forming a driver circuit on the glass substrate by using a thin film transistor, it is needed to protect the driver circuit from static electricity incidentally occurring at the processing step or assembling step.

FIG. 1 to FIG. 3 are drawings showing essential parts of a conventional structure that prevents damage due to static electricity. A structure that prevents damage of the driver circuit formed on a glass substrate is as shown in FIG. 1. Terminal electrodes 12a, 12b, 12c, and 12d are connected to the not shown driver circuit with signal wires 11a, 11b, 11c, and 11d, respectively. Further, the terminal electrodes 12a, 12b, 12c, and 12d are connected to each other through end resistors 13a, 13b, 13c, and 13d.

Sometimes, as shown in FIG. 2, diodes 14a, 14b, 14c, and 14d are disposed near the terminal electrodes 12a, 12c, 12c, and 12d. Or, sometimes, as shown in FIG. 3, a diode 17 is disposed between a power source terminal 15 and a ground terminal 16 in the driver circuit. In the driving circuit integrated type active matrix liquid crystal display device, these diodes 14a, 14b, 14c, 14d, and 17 are formed of, an N-type polysilicon thin film transistor 18 as shown in FIG. 4, or P-type polysilicon thin film transistor 19 as shown in FIG. 5.

However, only by connecting the terminal electrodes 12a, 12b, 12c, and 12d mutually through end resistances 13a, 13b, 13c, and 13d, it is difficult to prevent damage of the driver circuit caused by the static electricity. The withstand voltage of the polysilicon thin film transistor is about 30 V, and the polysilicon thin film transistor itself does not withstand static electricity. Accordingly, if the diodes 14a, 14b, 14c, 14d, and 17 are formed by using thin film transistors, once the diodes 14a, 14b, 14c, 14d, and 17 are damaged caused by the static electricity in the course of processing or assembling, sufficient electrostatic damage preventive function is not obtained in the subsequent process.

In addition to the damage due to static electricity applied from the terminal electrodes stated above, electrostatic damage may be also induced by peel charging. FIG. 6 is a signal wire layout for explaining electrostatic damage due to peel charging. FIG. 7 is an equivalent circuit diagram at the time of application of static electricity in this signal wire layout.

In the example shown in FIG. 6, a multi-layer wiring structure is employed. Signal wires 11a to 11d connected respectively to the first to fourth terminal electrodes 12a to 12d are formed in a second wiring layer 22. Of them, the signal wires 11b, 11c, and 11d are connected to signal wires 11e, 11f, and 11g formed in a first wiring layer 21 respectively through a contact portion 23. The signal wires 11e, 11f, and 11g cross beneath the signal wire 11a, that is, they are intersecting.

That is, when the signal wires intersect, one signal wire at the intersection is formed in the first wiring layer 21. The other signal wire is formed in the second wiring layer 22. Usually, a gate wiring is formed in the first wiring layer 21, and a data wiring is formed in the second wiring layer 22.

In such layout, if peel charging occurs and static electricity is applied, as shown in FIG. 7, charge Q1 and Q2 are generated between a substrate conveying system 24 and signal wire 11a, and the substrate conveying system 24 and signal wires 11b, 11c, and 11d, respectively, by way of the glass substrate acting as a dielectric (capacitance: Cd1, Cd2). At this time, since the glass substrate is very thin, for example, 0.7 mm, the values of Cd1 and Cd2 are very small. Accordingly, base on equation of $V=Q/C$, if peel charging occurs, V1 and V2 are about 1000 to 2000 V (volt), and the potential difference of V1 and V2 may be more than 100 V.

The withstand voltage of the interlayer insulating film interposed between the first wiring layer 21 and second wiring layer 22 shown in FIG. 6 is about 30 to 60 V. Therefore, a voltage of 100V is applied to the intersection of the signal wires 11e, 11f, and 11g formed in the first wiring layer 21 and the signal wire 11a formed in the second wiring layer 22, an electrostatic damage takes place. That is, hitherto, electrostatic damage was easily induced by peel charging.

In FIG. 7, meanwhile, Vin1 and Vin2 are terminal electrodes, and Vout1 and Vout2 are nodes at the intersection. Reference numeral C12 is a capacitance of the interlayer insulating film, and Rc is a resistance due to the contact portion 23.

SUMMARY OF THE INVENTION

It is an object of the present invention to provide a structure that prevents a semiconductor integrated circuit, which circuit is formed on a glass substrate or the like, to be damaged due to static electricity.

According to the structure of one aspect of the present invention, along a signal wire electrically connecting between a position estimated to generate static electricity and a position to be protected from static electricity, an auxiliary conductor is formed in a wiring layer beneath this signal wire. Accordingly, even if a voltage of 1000 to 2000 V is generated between the substrate conveying system and the auxiliary conductor due to static electricity, peel charging or the like, the voltage generated between the auxiliary conductor and signal wire may be suppressed to several volts only. Since the withstand voltage of the interlayer insulating film between the wiring layer forming the auxiliary conductor and the wiring layer forming the signal wire is about 30 to 60 V, electrostatic damage of the interlayer insulating film can be prevented.

According to the structure of another aspect of the present invention, when the second signal wire formed in an upper wiring layer crosses over the first signal wire formed in a lower wiring layer, a branching portion is formed in the first signal wire or second signal wire, and the second signal wire and first signal wire intersect together with the branching portion, and therefore, at the intersection, the capacitance of the interlayer signal wire provided between the first signal wire and second signal wire is twice as much. As a result, the voltage applied in the interlayer insulating film is about half of the prior art, that is, about 50 V. The withstand voltage of the interlayer insulating film is maximum 60 V, so that the electrostatic damage of the interlayer insulating film hardly takes place.

Other objects and features of this invention will become apparent from the following description with reference to the accompanying drawings.

BRIEF DESCRIPTION OF THE DRAWINGS

FIG. 4 is a diagram showing a diode composed of N type thin film transistor.

FIG. 5 is a diagram showing a diode composed of P type thin film transistor.

DESCRIPTION OF THE PREFERRED EMBODIMENTS

Preferred embodiments of the structure for preventing damage caused by static electricity of the invention are described in detail below with reference to the drawings.

Figure 1:
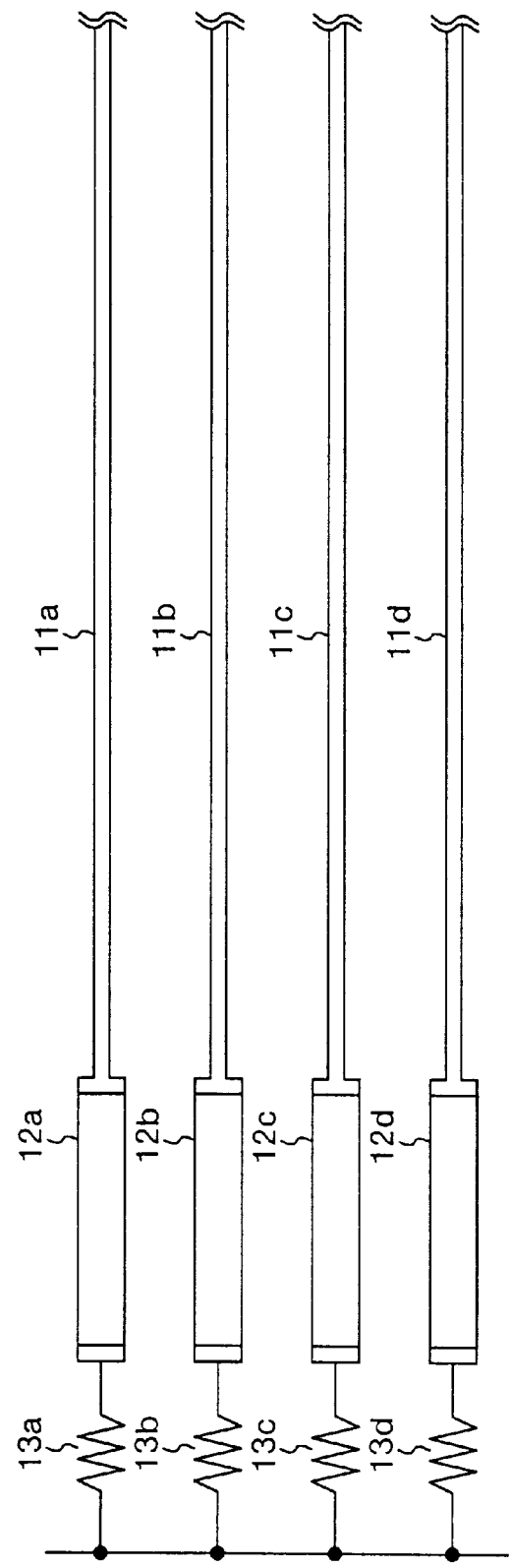
FIG. 1 is a diagram showing essential parts of a conventional structure for preventing damage caused by static electricity.
Figure 2:
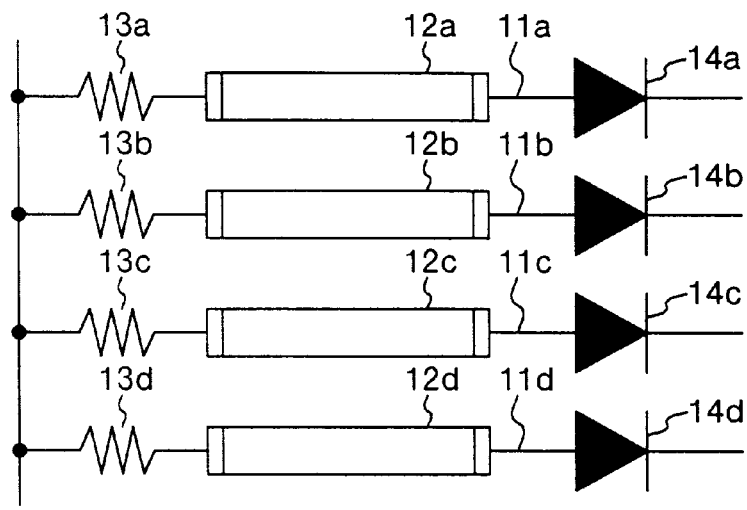
FIG. 2 is a diagram showing essential parts of a conventional structure for preventing damage caused by static electricity.
Figure 3:
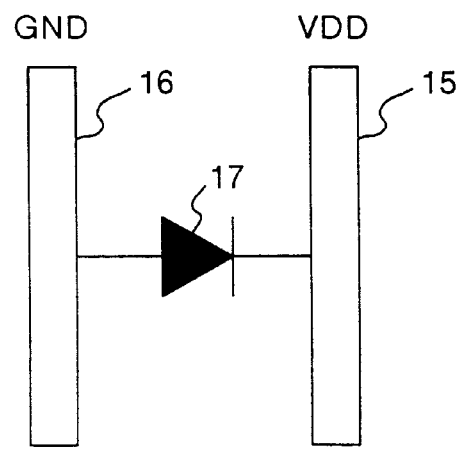
FIG. 3 is a diagram showing essential parts of a conventional structure for preventing damage caused by static electricity.
Figure 6:
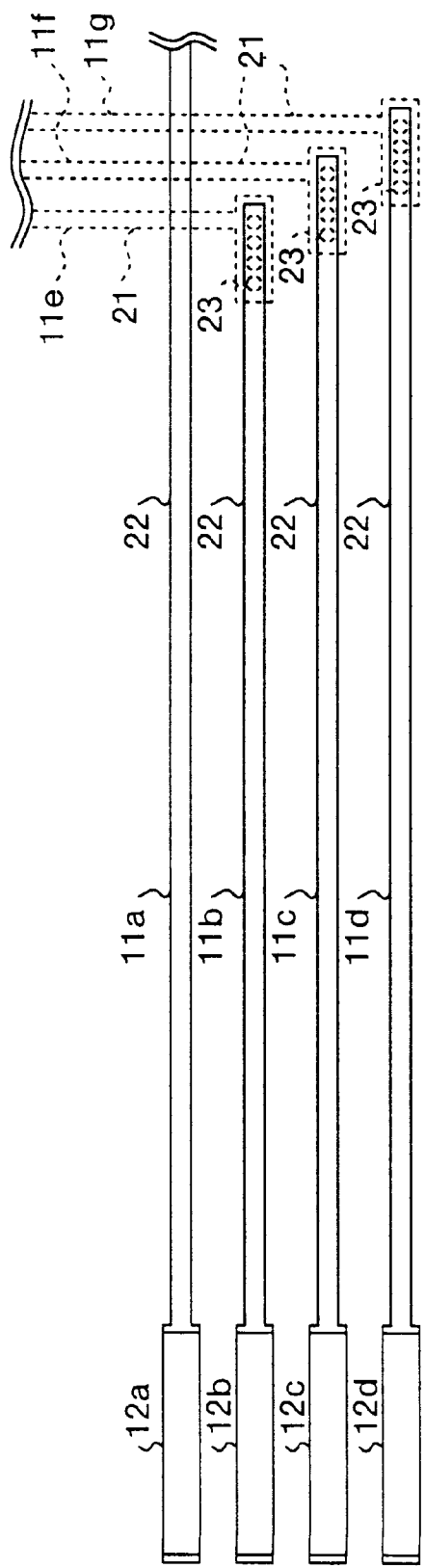
FIG. 6 is a diagram showing a conventional signal wire layout for explaining electrostatic damage due to peel charging.
Figure 7:
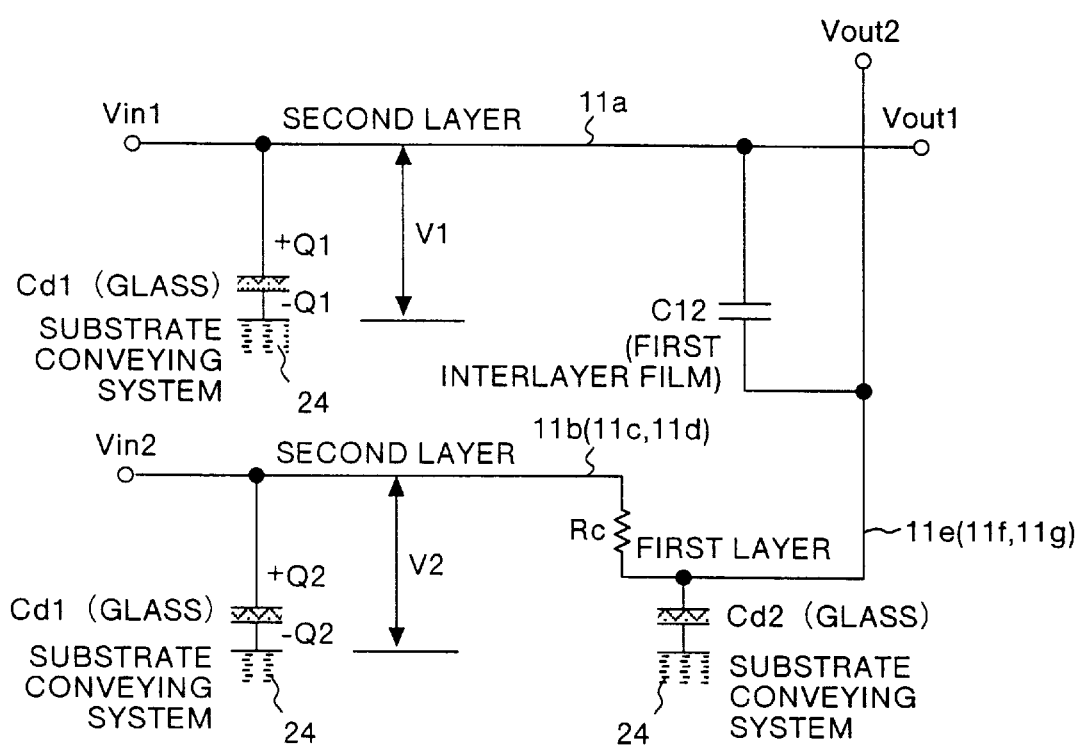
FIG. 7 is a diagram showing an equivalent circuit upon application of static electricity in the signal wire layout shown in FIG. 6.
Figure 8:
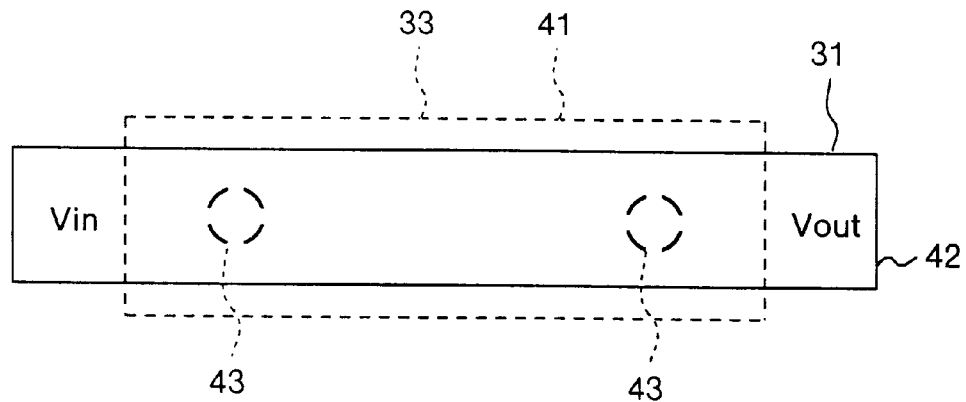
FIG. 8 is a diagram showing a signal wire layout for explaining the principle of a structure for preventing damage caused by static electricity according to the invention.
Figure 9:
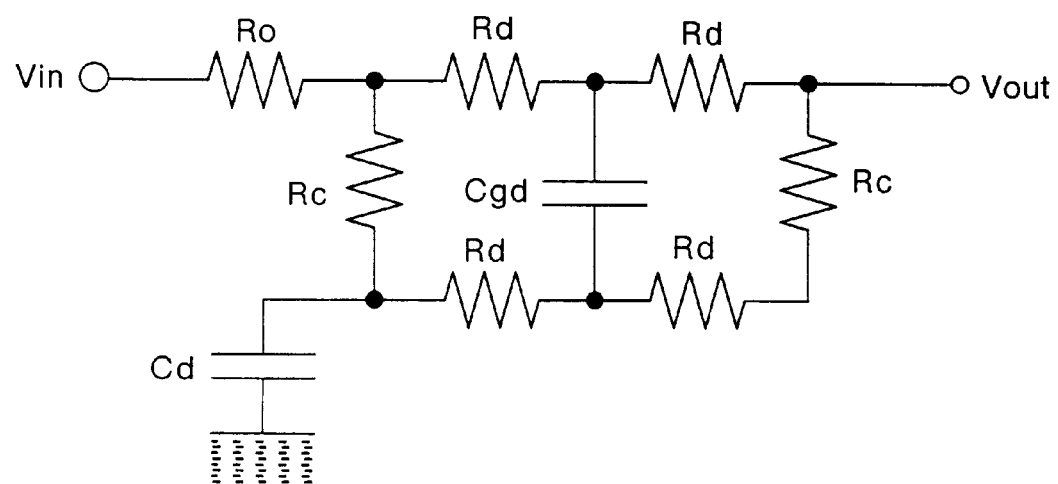
FIG. 9 is a circuit diagram of the layout shown in FIG. 8.
Figure 10:
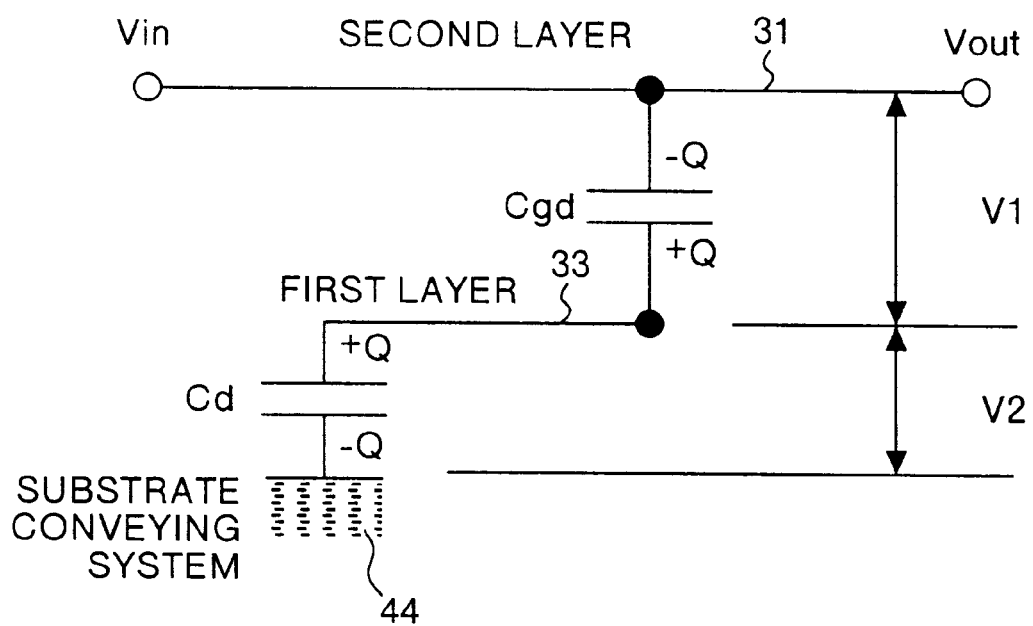
FIG. 10 is a diagram showing an equivalent circuit upon application of static electricity in the circuit shown in FIG. 9.

FIG. 8 is a diagram showing a signal wire layout for explaining the principle of the structure according to the invention. FIG. 9 is a circuit diagram of the layout shown in FIG. 8, and FIG. 10 is a diagram showing an equivalent circuit upon application of static electricity in this circuit. It is a feature of the invention, as shown in FIG. 8, that an auxiliary conductor 33 is formed along a signal wire 31 for electrically connecting between a position (Vin) estimated to generate static electricity and a position (Vout) to be protected from static electricity, in a wiring layer beneath this signal wire 31.

The position estimated to generate static electricity is, for example, terminal electrode Vin. The position to be protected from static electricity is, for example, intersecting position Vout with the signal wire, not shown, in which the signal wire 31 connected to the terminal electrode Vin is formed in other wiring layer. Or, when the signal wire 31 is formed in a second wiring layer 42, the auxiliary conductor 33 is formed in a first wiring layer 41 through an insulating film not shown. In the example shown in FIG. 8, the signal wire 31 and auxiliary conductor 33 are connected electrically through the contact portion 43.

In FIG. 9, Rc denotes a resistance due to the contact portion 43, Ro and Rd denote wiring resistances, Cd is the capacitance of the glass substrate, and Cgd is a capacitance of the interlayer insulating film between the first wiring layer and second wiring layer.

When static electricity is generated, as shown in FIG. 10, a charge Q2 is generated between substrate conveying system 44 and auxiliary conductor 33, with the glass substrate working as a dielectric. Between the auxiliary conductor 33 and signal wire 31, a charge Q1 is generated with the interlayer insulating film working as a dielectric. Base on equation of V=Q/C, the relation expressed in the following equation (1) is established among V1, V2, Cd and Cgd.

$$V1{:}V2 = Q/Cgd {:} Q/Cd \qquad (1)$$

Since the capacitance Cd of the glass substrate is about 1/1000 of the capacitance Cgd of the interlayer insulating film, V1 is about 1/1000 of V2, that is, V2/1000. Therefore, if V2 becomes 1000 to 2000 V due to static electricity, V1 is only about several volts lower than the withstand voltage of the interlayer insulating film (about 30 to 60 V), so that electrostatic damage of the interlayer insulating film can be prevented.

In a next aspect of the invention, when the second signal wire formed in an upper wiring layer crosses over the first signal wire formed in a lower wiring layer, a branching portion for branching off from the first signal wire is formed, and the second signal wire crosses over the branching portion together with the first signal wire. Or, by forming a branching portion in the second signal wire, the second signal wire and branching portion may be designed to cross over the first signal wire.

Thus, in the intersection area of the first signal wire and second signal wire, the capacitance of the interlayer signal wire provided between the first signal wire and second signal wire is twice as much, so that the voltage applied in the interlayer insulating film is about half of the prior art, that is, about 50 V. Therefore, electrostatic damage of the interlayer insulating film hardly takes place.

Figure 11:
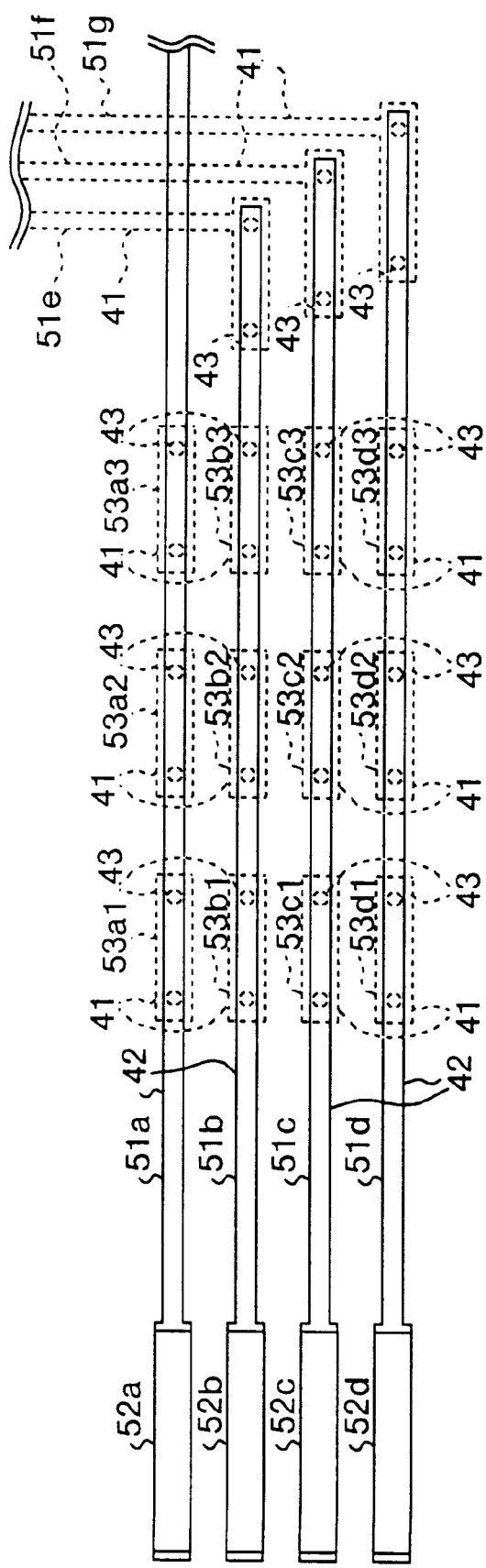
FIG. 11 is a diagram showing a signal wire layout of structure for preventing damage caused by static electricity in a first embodiment.

FIG. 11 is a diagram showing a signal wire layout of the structure for preventing damage caused by static electricity in a first embodiment of the present invention. First to fourth signal wires 51a, 51b, 51c, and 51d respectively connected to first and fourth terminal electrodes 52a, 52b, 52c, and 52d are formed in a second wiring layer 42. Of them, the second to fourth signal wires 51b, 51c, and 51d are respectively connected to fifth to seventh signal wires 51e, 51f, and 51g formed on a first wiring layer 41 through a contact portion 43. The fifth to seventh signal wires 51e, 51f, and 51g cross beneath the first signal wire 51a. Usually, a gate wiring is formed in the first wiring layer 41, and a data wiring is formed in the second wiring layer 42.

In the structure for preventing damage caused by static electricity in the first embodiment, first to fourth groups of auxiliary conductors are formed in the first wiring layer 41, that is, 53a1 to 53a3, 53b1 to 53b3, 53c1 to 53c3, and 53d1 to 53d3. These auxiliary conductors 53a1 to 53a3, 53b1 to 53b3, 53c1 to 53c3, and 53d1 to 53d3 are disposed along the signal wires 51a, 51b, 51c, and 51d, intermittently and in mutually separate state, at the intersections of the first to fourth terminal electrodes 52a, 52b, 52c, and 52d, and the fifth to seventh signal wires 51e, 51f, and 51g, with the first signal wire 51a.

The reason why the auxiliary conductors 53a1 to 53a3, 53b1 to 53b3, 53c1 to 53c3, and 53d1 to 53d3 are provided intermittently is that the first wiring layer 41 is usually the gate wiring. That is, in the first wiring layer 41, when the wiring length becomes long, discharge occurs among the signal wires formed in the first wiring layer 41, and the characteristic of the thin film transistor deteriorates.

The auxiliary conductors 53a1 to 53a3, 53b1 to 53b3, 53c1 to 53c3, and 53d1 to 53d3 are electrically connected to signal wires 51a, 51b, 51c, and 51d through the contact portion 43. This structure can be fabricated by a known device process.

Figure 12:
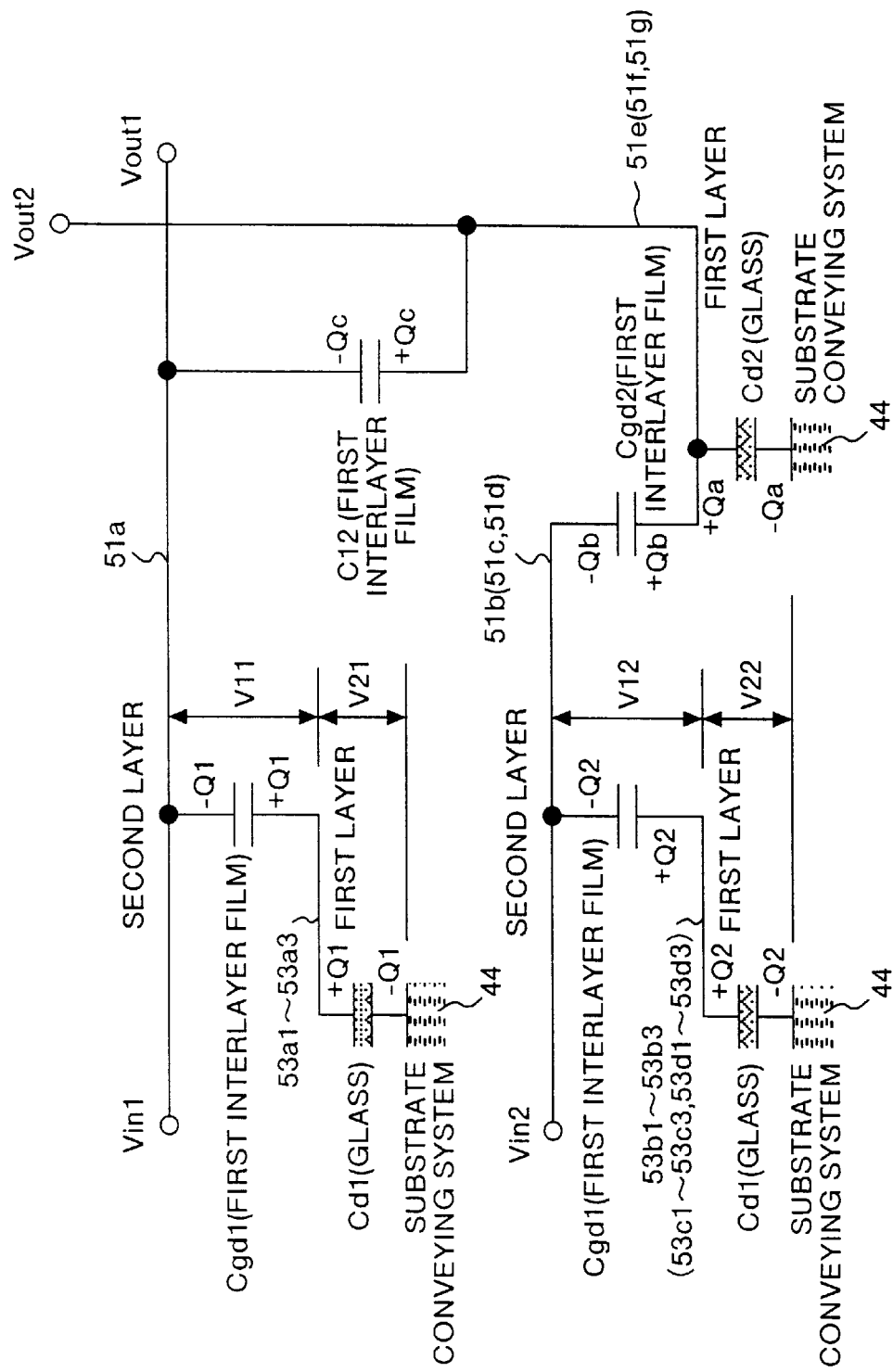
FIG. 12 is a diagram showing an equivalent circuit upon application of static electricity in the signal wire layout shown in FIG. 11.

The operation of the first embodiment will now be explained. FIG. 12 is a diagram showing an equivalent circuit upon application of static electricity in the signal wire layout shown in FIG. 11. In such layout, when peel charging occurs and static electricity is applied, a charge Q1 is generated between the substrate conveying system 44 and the first group of auxiliary conductors 53a1 to 53a3. Between the first group of auxiliary conductors 53a1 to 53a3, and the first signal wire 51a, a voltage V11 is generated.

Further, a charge Q2 is generated between the substrate conveying system 44 and the second and fourth groups of auxiliary conductors 53b1 to 53b3, 53c1 to 53c3, and 53d1 to 53d3. A voltage V12 is generated between the second and fourth groups of auxiliary conductors 53b1 to 53b3, 53c1 to 53c3, and 53d1 to 53d3, and the second to fourth signal wires 51b, 51c, and 51d.

Suppose that the capacitance of the glass electrode between the substrate conveying system 44 and the auxiliary conductors 53a1 to 53a3, 53b1 to 53b3, 53c1 to 53c3, and 53d1 to 53d3 is Cd1. Further, suppose that the capacitance of the interlayer insulating film between the auxiliary conductors 53a1 to 53a3, 53b1 to 53b3, 53c1 to 53c3, and 53d1 to 53d3, and the first to fourth signal wires 51a, 51b, 51c, and 51d is Cgd1. In such a case, the relation represented by the following equation (2) is established among V11, V21, Cd1, and Cgd1.

$$V11:V21 = 1/Cgd1 : 1/Cd1 \qquad (2)$$

Besides, among V12, V22, Cd1, and Cdg1, the relation represented by the following equation (3) is established.

$$V12:V22 = 1/Cgd1 : 1/Cd1 \qquad (3)$$

Since Cd1 is about 1/1000 of Cgd1, V11 and V12 are about 1/1000 of V21 and V22, respectively. Further, since the auxiliary conductors formed in the first layer are dispersed and disposed at nearly equal intervals in layout, the potential difference among the auxiliary conductors is suppressed within about ±10 V.

Accordingly, $$Va:Vb \approx 1/Cd2 : 1/(Cgd1+Cgd2)$$

$$Va:Vc \approx 1/Cd2 : 1/(C12+Cgd1)$$

Therefore, if V21 and V22 become about 1000 to 2000 V due to peel charging or the like, the voltage Vout2−Vout1 (=Vc) applied to the interlayer insulating film is several volts. In other words, if the amount of charge generated by peel charging varies, only several volts is applied to the interlayer insulating film, and hence damage due to static electricity does not take place.

In FIG. 12, Cd2 is the capacitance of the glass electrode between the substrate conveying system 44, and the fifth to seventh signal wires 51e, 51f, and 51g. Further, Cgd2 is the capacitance of the interlayer insulating film between the second to fourth signal wires 51b, 51c, and 51d, and the fifth to seventh signal wires 51e, 51f, and 51g. Finally, C12 is the capacitance of the interlayer insulating film between the fifth to seventh signal wires 51e, 51f, and 51g, and the first signal wire 51a.

According to the first embodiment, by application of static electricity due to peel charging or the like, if the voltage between the substrate conveying system 44 and the auxiliary conductors 53a1 to 53a3, 53b1 to 53b3, 53c1 to 53c3, and 53d1 to 53d3 becomes 1000 to 2000 V, the voltage between the auxiliary conductors 53a1 to 53a3, 53b1 to 53b3, 53c1 to 53c3, and 53d1 to 53d3, and the signal wires 51a, 51b, 51c, and 51d, that is, the voltage applied to the interlayer insulating film is only about several volts. Since the withstand voltage of the interlayer insulating film is about 30 to 60 V, if the amount of charge generated by peel charging fluctuates, the electrostatic damage of the interlayer insulating film can be prevented. As a result, a liquid crystal display of high yield can be formed, and the productivity is enhanced, so that the liquid crystal display device can be presented at low cost.

In the first embodiment, three auxiliary conductors are provided in each signal wire, but not limited to this example, the number of auxiliary conductors in each signal wire may be two or less or four or more. Anyway, they should be disposed on the whole surface as uniformly as possible from the viewpoint of layout. At this time, the number of auxiliary conductors is not particularly specified. Incidentally, the first to fourth signal wires 51a, 51b, 51, and 51d, and the first to fourth groups of auxiliary conductors 53a1 to 53a3, 53b1 to 53b3, 53c1 to 53c3, and 53d1 to 53d3 may not be connected electrically to each other.

Figure 13:
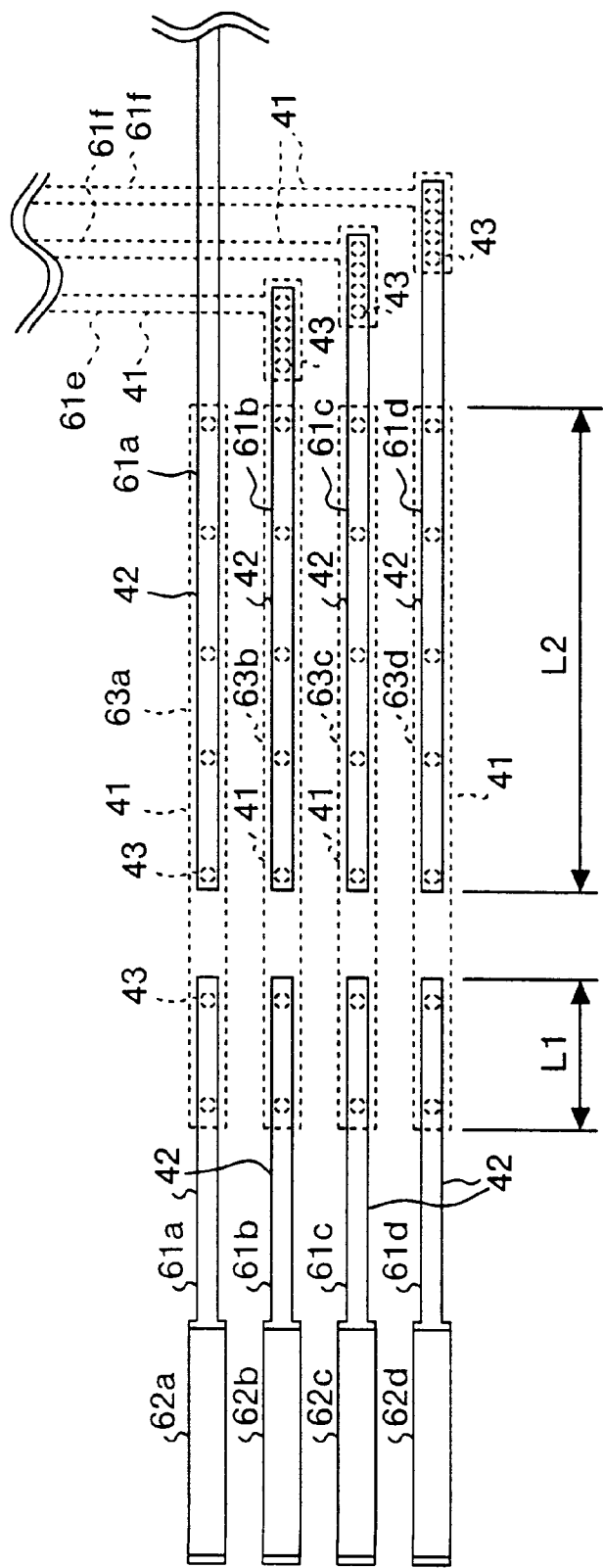
FIG. 13 is a diagram showing a signal wire layout of structure for preventing damage caused by static electricity in a second embodiment.

FIG. 13 is a diagram showing a signal wire layout of the structure according to a second embodiment of the present invention. First to fourth signal wires 61a, 61b, 61c, and 61d connected respectively to first to fourth terminal electrodes 62a, 62b, 62c, and 62d are formed in a second wiring layer 42, and are broken once halfway. Of them, the second to fourth signal wires 61b, 61c, and 61d are connected respectively to fifth to seventh signal wires 61e, 61f, and 61g formed in a first wiring layer 41 through a contact portion 43. The fifth to seventh signal wires 61e, 61f, and 61g cross beneath the first signal wire 61a.

In the structure according to the second embodiment, first to fourth auxiliary conductors 63a, 63b, 63c, and 63d are formed in the first wiring layer 41. These auxiliary conductors 63a, 63b, 63c, and 63d are disposed along the signal wires 61a, 62b, 62c, and 61d, at the intersections of the first to fourth terminal electrodes 62a, 62b, 62c, and 62d and the fifth to seventh signal wires 61e, 61f, and 61g with the first signal wire 61a.

The first to fourth signal wires 61a, 61b, 61c, and 61d are once cut off halfway above the auxiliary conductors 63a, 63b, 63c, and 63d, at the positions closer to the terminal electrodes 62a, 62b, 62c, and 62d. That is, of the overlapping portions of the first to fourth signal wires 61a, 61b, 61c, and 61d and the auxiliary conductors 63a, 63b, 63c, and 63d, the length L2 of the portion overlapped at the intersecting side of the fifth to seventh signal wires 61e, 61f, and 61g and the first signal wire 61a is longer than the length L1 of the portion overlapped at the side of the terminal electrodes 62a, 62b, 62c, and 62d. Preferably, L2 is more than twice as long L1.

Of the first to fourth signal wires 61a, 61b, 61c, and 61d, the portion of length L1 and the portion of length L2 are electrically connected to the auxiliary conductors 63a, 63b, 63c, and 63d, through the contact portion 43. This structure can be manufactured in a known device process.

Figure 14:
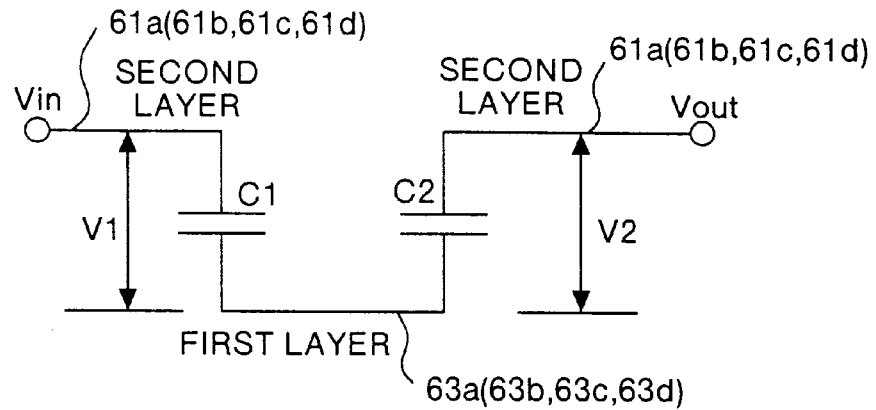
FIG. 14 is a diagram showing an equivalent circuit upon application of static electricity in each signal wire in the signal wire layout shown in FIG. 13.

The operation of the second embodiment will now be explained. FIG. 14 is a diagram showing an equivalent circuit upon application of static electricity in each signal wire in the signal wire layout shown in FIG. 13. When a static electricity is applied to the terminal electrode Vin, between the terminal electrode Vin and the intersection Vout with the signal wire, voltages V1 and V2 are generated as the interlayer insulating film between the first to fourth signal wires 61a, 61b, 61c, and 61d, and the auxiliary conductors 63a, 63b, 63c, and 63d acts as a dielectric.

The voltage V1 is generated in the portion overlapped at the side of the terminal electrodes 62a, 62b, 62c, and 62d (the portion of length L1 in FIG. 13), of the overlapping portions of the first to fourth signal wires 61a, 61b, 61c, and 61d, and the auxiliary conductors 63a, 63b, 63c, and 63d. The voltage V2 is generated in the portion overlapped at the signal wire intersecting side (the portion of length L2 in FIG. 13), of the overlapping portions of the first to fourth signal wires 61a, 61b, 61c, and 61d, and the auxiliary conductors 63a, 63b, 63c, and 63d. Reference numerals C1 and C2 are capacities of the interlayer insulating film in the portions of length L1 and L2.

Herein, among V1, V2, C1 and C2, the relation represented by the following equation (4) is established.

$$V1:V2=1/C1:1/C2 \quad (4)$$

As mentioned above, since L2 is longer than L1, C2 is greater than C1. Therefore, V2 is smaller than V1. That is, when a static electricity is applied, in the interlayer insulating film at the signal wire intersecting side, a voltage smaller than that of the interlayer insulating film at the terminal electrode side is applied. By properly setting the ratio of L1 and L2, the voltage applied in the interlayer insulating film at the signal wire intersecting side can be suppressed low.

Figure 15:
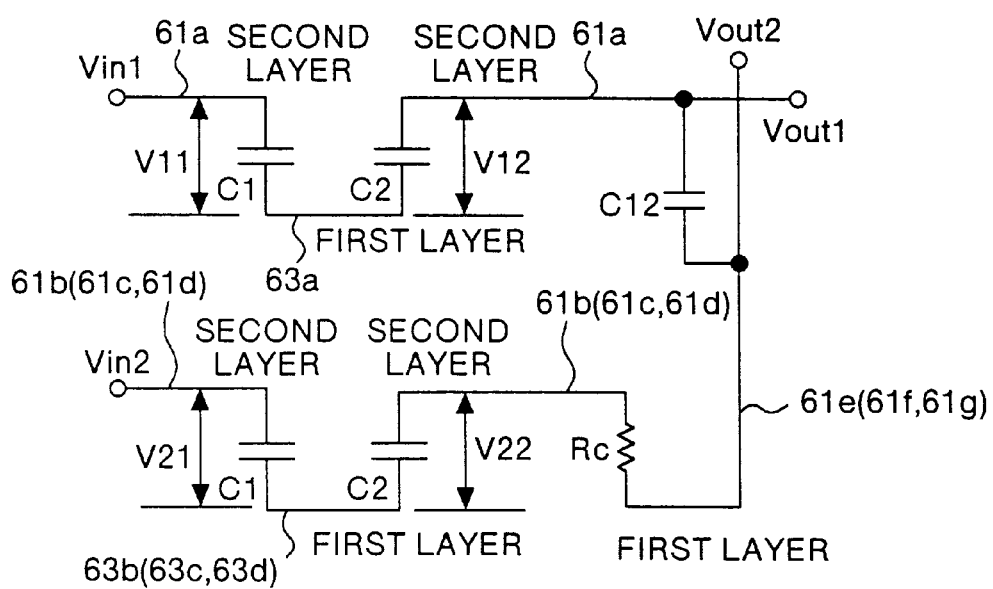
FIG. 15 is a diagram showing an equivalent circuit upon application of static electricity in the signal wire layout shown in FIG. 13.

FIG. 15 is a diagram showing an equivalent circuit upon application of static electricity in the signal wire layout shown in FIG. 13. When a static electricity is applied in the terminal electrodes Vin1 and Vin2, a voltage V11 is generated in the portion of length L1 in FIG. 13 between the first signal wire 61a and auxiliary conductor 63a, and a voltage V12 is generated in the portion of length L2 in FIG. 13. Further, between the second to fourth signal wires 61b, 61c, and 61d, and the auxiliary conductors 63b, 63c, and 63d, a voltage V21 is generated in the portion of length L1 in FIG. 13 and a voltage V22 is generated in the portion of length L2 in FIG. 13.

As explained in relation to FIG. 14, since C2 is greater than C1, V12 and V22 are smaller than V11 and V21, respectively. Herein, when L1 and L2 are set so that C1 may be about 1/10 of C2, V12 and V22 become about 1/10 of V11 and V21, respectively. Therefore, if there is a fluctuation in the static electricity applied between terminal electrodes and a potential difference is produced in V11 and V21, the potential difference of V12 and V22 is 1/10 thereof. That is, the voltage applied to the interlayer insulating film in the intersecting portion of signal wires is 1/10 of the potential difference of V11 and V21.

In FIG. 15, Rc denotes resistance due to the contact portion, and C12 is a capacitance of the interlayer insulating film between the fifth to seventh signal wires 61e, 61f, and 61g, and the first signal wire 61a.

According to the second embodiment, if there is a potential difference in the static electricity applied between terminal electrodes, the voltage applied to the interlayer insulating film in the intersecting portion of signal wires is smaller than the potential difference between the terminal electrodes, for example, 1/10. That is, the voltage applied to the interlayer insulating film of the intersecting portion can be suppressed below the withstand voltage, so that damage of the interlayer insulating film caused by static electricity can be prevented. Therefore, a liquid crystal display of high yield can be formed, and the productivity is enhanced, so that the liquid crystal display device can be presented at low cost.

Figure 16:
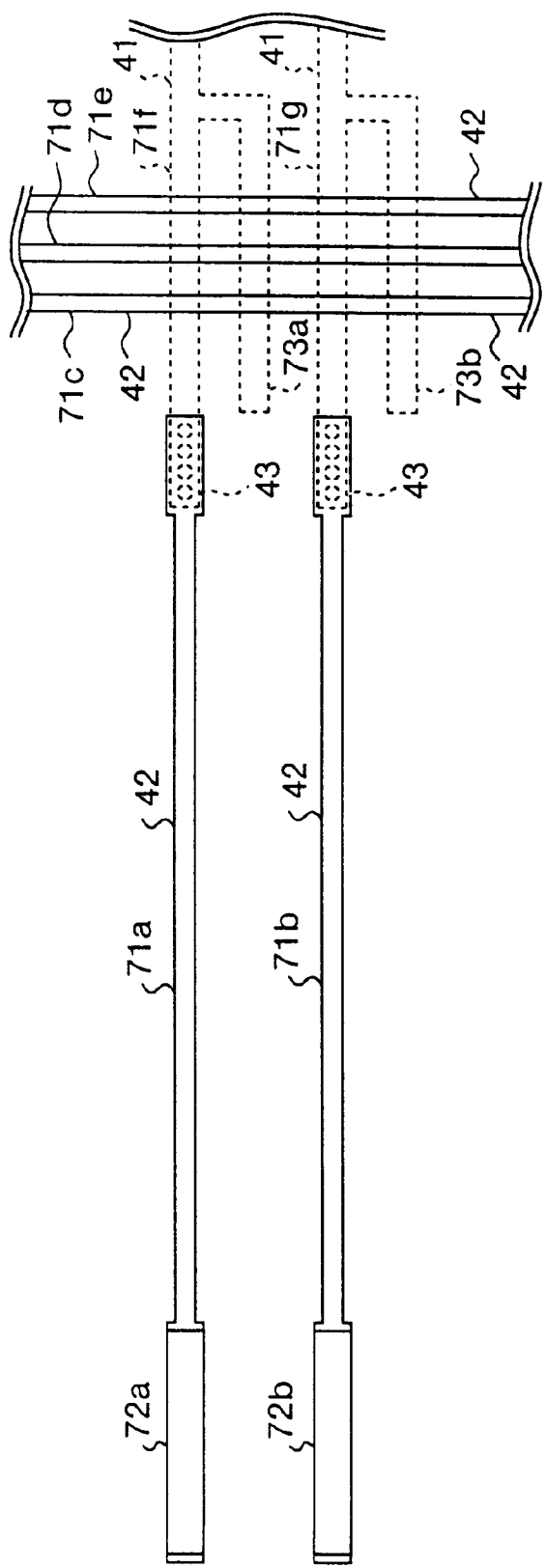
FIG. 16 is a diagram showing a signal wire layout of structure for preventing damage caused by static electricity in a third embodiment.

FIG. 16 is a diagram showing a signal wire layout of the structure according to a third embodiment of the present invention. First and second signal wires 71a and 71b connected respectively to first and second terminal electrodes 72a and 72b are formed in a second wiring layer 42. Third to fifth signal wires 71c, 71d, and 71e are formed in the second wiring layer 42. The first and second signal wires 71a and 71b are connected to sixth and seventh signal wires 71f and 71g formed in a first wiring layer 41 through a contact portion 43.

In the structure according to the third embodiment, branching portions 73a and 73b branched off from the sixth to seventh signal wires 71f and 71g are formed in the first wiring layer 41. These branching portions 73a and 73b are connected electrically to the sixth and seventh signal wires 71f and 71g, respectively. The sixth and seventh signal wires 71f and 71g cross beneath the third to fifth signal wires 71c, 71d, and 71e, together with the branching portions 73a and 73b. The branching portions 73a and 73b may be also branched off toward the side of the terminal electrodes 72a and 72b, or may be branched off in the opposite direction. This structure can be manufactured in a known device process.

According to the third embodiment, since the sixth and seventh signal wires 71f and 71g formed in the first wiring layer 41 cross beneath the third to fifth signal wires 71c, 71d, and 71e formed in the second wiring layer 42, together with the branching portions 73a and 73b branched therefrom, at the intersecting portion, the capacitance of the interlayer insulating film between the first wiring layer 41 and second wiring layer 42 is twice as much. That is, the voltage applied to the interlayer insulating film is about 50 V, or half of the conventional value. Since the withstand voltage of the interlayer insulating film is 60 V at maximum, in the intersecting portion of signal wires, electrostatic damage of the interlayer insulating film hardly takes place. Therefore, a liquid crystal display of high yield can be formed, and the productivity is enhanced, so that the liquid crystal display device can be presented at low cost.

Figure 17:
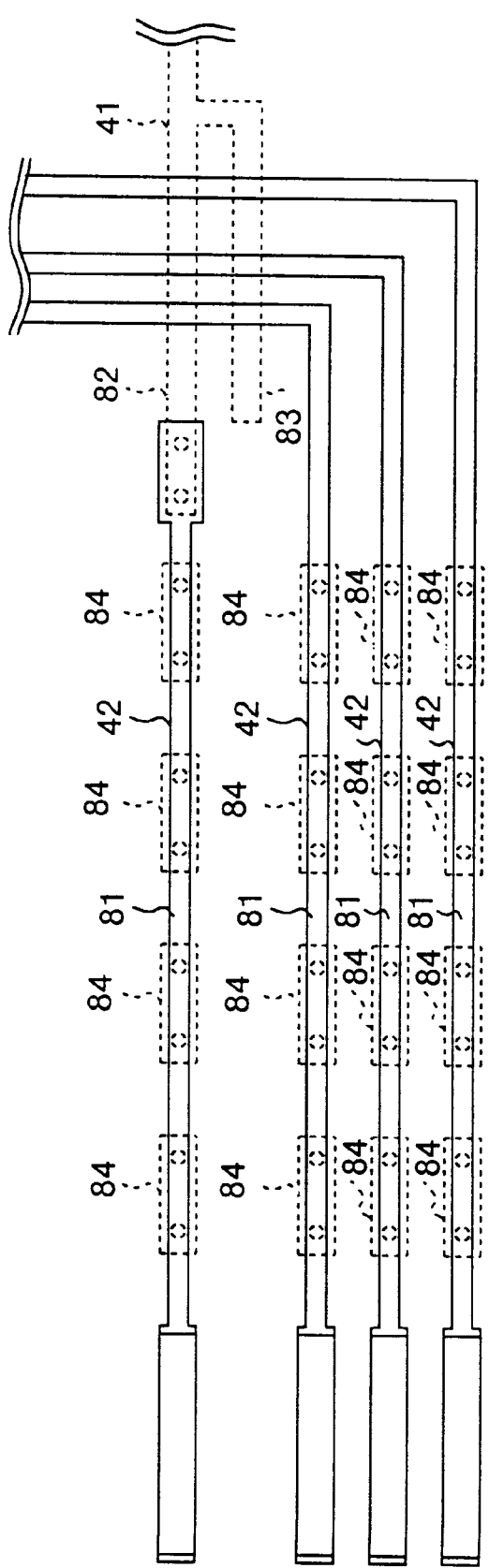
FIG. 17 is a diagram showing a signal wire layout of structure for preventing damage caused by static electricity in a fourth embodiment.

FIG. 17 is a diagram showing a signal wire layout of the structure according to a fourth embodiment of the present invention. The fourth embodiment is a case where the structure according to the first embodiment is applied in the structure according to the third embodiment. That is, in the portion of a signal wire 82 formed in a first wiring layer 41 crossing beneath a signal wire 81 formed in a second wiring layer 42, a branching portion 83 branched off from the signal wire 82 also crosses beneath the signal wire 81. Further, beneath the signal wire 81, a plurality of auxiliary conductors 84 are provided intermittently along the signal wire 81. This structure can be manufactured in a known device process. According to the fourth embodiment, the effects of the first embodiment are obtained in addition to the effects of the third embodiment.

Figure 18:
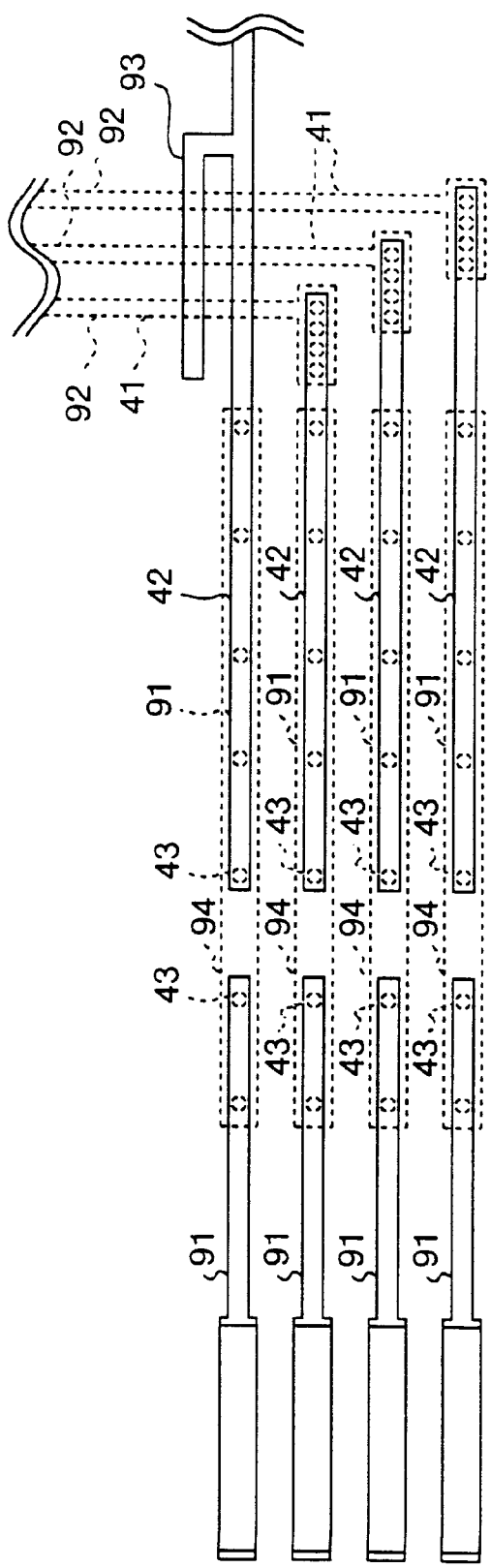
FIG. 18 is a diagram showing a signal wire layout of structure for preventing damage caused by static electricity in a fifth embodiment.

FIG. 18 is a diagram showing a signal wire layout of the structure according to a fifth embodiment of the present invention. The fifth embodiment is a case where the structure according to the second embodiment is applied in the structure according to the third embodiment. That is, in the portion of a signal wire 92 formed in a first wiring layer 41 crossing beneath a signal wire 91 formed in a second wiring layer 42, the signal wire 91 has a branching portion 93, and the signal wire 92 crosses beneath the branching portion 93. Further, beneath the signal wire 91, an auxiliary conductor 94 is provided along the signal wire 91. The signal wire 91 is once broken halfway, and is mutually connected electrically through the contact portion 43 and the auxiliary conductor 94. This structure can be manufactured in a known device process. According to the fifth embodiment, the effects of the second embodiment are obtained in addition to the effects of the third embodiment.

The invention is not limited to the structure for preventing damage caused by static electricity for semiconductor integrated circuit formed on a glass substrate, but may be also applied in a structure for preventing damage caused by static electricity for integrated circuit formed on a semiconductor substrate.

As described herein, according to one aspect of the present invention, along a signal wire electrically connecting between a position estimated to generate static electricity and a position to be protected from static electricity, an auxiliary conductor is formed in a wiring layer beneath this signal wire. Accordingly, if a voltage of 1000 to 2000 V may be generated between the substrate conveying system and the auxiliary conductor in the case a static electricity is generated due to peel charging or the like, the voltage generated between the auxiliary conductor and signal wire may be suppressed to several volts only. Since the withstand voltage of the interlayer insulating film between the wiring layer forming the auxiliary conductor and the wiring layer forming the signal wire is about 30 to 60 V, electrostatic damage of the interlayer insulating film can be prevented.

According to one aspect of the present invention, when the second signal wire formed in an upper wiring layer crosses over the first signal wire formed in a lower wiring layer, a branching portion is formed in the first signal wire or second signal wire, and the second signal wire and first signal wire intersect together with the branching portion, and therefore, at the intersection, the capacitance of the interlayer signal wire provided between the first signal wire and second signal wire is twice as much. As a result, the voltage applied in the interlayer insulating film is about half of the prior art, that is, about 50 V. The withstand voltage of the interlayer insulating film is maximum 60 V, so that the electrostatic damage of the interlayer insulating film hardly takes place.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A structure for preventing damage caused by static electricity in peripheral circuits including a drive circuit of a peripheral circuits integrated type liquid crystal display device with said peripheral circuits mounted on a glass substrate, said structure comprising:

a first signal wire formed on a glass substrate;

an insulating film disposed on said first signal wire;

a second signal wire disposed on said insulating film, and crossing over said first signal wire; and an auxiliary conductor disposed along and beneath said second signal wire, near the crossing area of the second signal wire and the first signal wire, in the same wiring layer as said first signal wire, and separate from said first signal wire.

2. The structure according to claim 1, wherein a plurality of auxiliary conductors are provided in a mutually remote state.

3. The structure according to claim 1, wherein said auxiliary conductor is connected electrically to said second signal wire through a contact portion.

4. The structure according to claim 1, wherein said second signal wire is once broken halfway, and is mutually connected electrically through the contact portion and said auxiliary conductor.

5. The structure according to claim 4, wherein the base portion of said second signal wire is connected to a terminal electrode, and said second signal wire is broken halfway so that the capacitance produced with the auxiliary conductor at the terminal electrode side may be greater than the capacitance produced with the auxiliary conductor at the first signal wire crossing side.

6. The structure according to claim 1, wherein said first signal wire, insulating film, and second signal wire are formed on a same glass substrate.

7. A structure for preventing damage caused by static electricity in peripheral circuits including a drive circuit of a peripheral circuits integrated type liquid crystal display device with said peripheral circuits mounted on a glass substrate, said structure comprising:

a first signal wire;

an insulating film disposed on said first signal wire;

a second signal wire disposed on said insulating film, and crossing over said first signal wire; and wherein said first signal wire includes a branching portion branched off from said first signal wire, the branching portion also crossing beneath said second signal wire.

8. The structure according to claim 7, wherein an auxiliary conductor is disposed along and beneath said second signal wire, in the same wiring layer as said first signal wire.

9. The structure according to claim 8, wherein a plurality of auxiliary conductors are provided in a mutually remote state.

10. The structure according to claim 8, wherein said auxiliary conductor is connected electrically to said second signal wire through a contact portion.

11. The structure according to claim 7, wherein said first signal wire, insulating film, and second signal wire are formed on a same glass substrate.

12. A structure for preventing damage caused by static electricity in peripheral circuits including a drive circuit of a peripheral circuits integrated type liquid crystal display device with said peripheral circuits mounted on a glass substrate, said structure comprising:

a first signal wire;

an insulating film disposed on said first signal wire;

a second signal wire disposed on said insulating film, and crossing over said first signal wire;

a branching portion branched off from said second signal wire and crossing over said first signal wire;

an auxiliary conductor disposed along and beneath said second signal wire, in the same wiring layer as said first signal wire; and wherein said second signal wire is once broken halfway, and is mutually connected electrically through the contact portion of said auxiliary conductor.

13. The structure according to claim 12, wherein the base portion of said second signal wire is connected to a terminal electrode, and said second signal wire is broken halfway so that the capacitance produced with the auxiliary conductor at the terminal electrode side may be greater than the capacitance produced with the auxiliary conductor at the first signal wire crossing side.

14. A liquid crystal display device comprising:

a glass substrate;

a first signal wire formed on the glass substrate;

an insulating film disposed on said first signal wire;

a second signal wire disposed on said insulating film, and crossing over said first signal wire; and an auxiliary conductor disposed along and beneath said second signal wire, near the crossing area of the second signal wire and the first signal wire, in the same wiring layer as said first signal wire, and separate from said first signal wire.

15. A liquid crystal display device comprising:

a glass substrate;

a first signal wire formed on the glass substrate;

an insulating film disposed on said first signal wire;

a second signal wire disposed on said insulating film, and crossing over said first signal wire; and wherein said first signal wire includes a branching portion branched off from said first signal wire, the branching portion also crossing beneath said second signal wire.

16. A liquid crystal display device comprising:

a glass substrate;

a first signal wire formed on the glass substrate;

an insulating film disposed on said first signal wire;

a second signal wire disposed on said insulating film, and crossing over said first signal wire;

a branching portion branched off from said second signal wire and crossing over said first signal wire;

an auxiliary conductor disposed along and beneath said second signal wire, in the same wiring layer as said first signal wire; and wherein said second signal wire is once broken halfway, and is mutually connected electrically through a contact portion of said auxiliary conductor.

17. The liquid crystal display device according to claim 16, wherein the base portion of said second signal wire is connected to a terminal electrode, and said second signal wire is broken halfway so that the capacitance produced with the auxiliary conductor at the terminal electrode side may be greater than the capacitance produced with the auxiliary conductor at the first signal wire crossing side.

* * * * *